(12) United States Patent
Sears et al.

(10) Patent No.: US 10,224,177 B2
(45) Date of Patent: Mar. 5, 2019

(54) METHOD AND SYSTEM FOR ABERRATION CORRECTION IN AN ELECTRON BEAM SYSTEM

(71) Applicant: KLA-Tencor Corporation, Milpitas, CA (US)

(72) Inventors: Christopher Sears, Fremont, CA (US); Xinrong Jiang, Palo Alto, CA (US); Sameet K. Shriyan, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/148,331

(22) Filed: May 6, 2016

(65) Prior Publication Data
US 2016/0329189 A1   Nov. 10, 2016

Related U.S. Application Data

(60) Provisional application No. 62/158,632, filed on May 8, 2015.

(51) Int. Cl.
*H01J 37/28* (2006.01)
*H01J 37/147* (2006.01)

(52) U.S. Cl.
CPC .......... *H01J 37/28* (2013.01); *H01J 37/1474* (2013.01); *H01J 2237/1534* (2013.01); *H01J 2237/1536* (2013.01)

(58) Field of Classification Search
CPC ...... H01J 37/14; H01J 37/141; H01J 37/1474; H01J 37/1475; H01J 37/1477; H01J 37/28; H01J 2237/1534; H01J 2237/1536
See application file for complete search history.

(56) References Cited

U.S. PATENT DOCUMENTS 4,795,912 A * 1/1989 Maschke .................. G21K 1/08
250/396 ML
5,051,556 A * 9/1991 Sakamoto .............. B82Y 10/00
219/121.25
(Continued)

FOREIGN PATENT DOCUMENTS

CN      104380427 A     2/2015
JP       05275058 A  * 10/1993
WO  WO 2013152028 A1 * 10/2013 .............. H01J 37/05

OTHER PUBLICATIONS

International Search Report for Application No. PCT/US2016/031322 dated Jul. 26, 2016, 3 pages.
(Continued)

*Primary Examiner* — David E Smith
(74) *Attorney, Agent, or Firm* — Suiter Swantz pc llo

(57) ABSTRACT

A scanning electron microscopy system is disclosed. The system includes an electron beam source configured to generate a primary electron beam. The system includes a sample stage configured to secure a sample. The system includes a set of electron-optical elements configured to direct at least a portion of the primary electron beam onto a portion of the sample. The set of electron-optical elements includes an upper deflector assembly and a lower deflector assembly. The upper deflector assembly is configured to compensate for chromatic aberration in the primary electron beam caused by the lower deflector assembly. In addition, the system includes a detector assembly configured to detect electrons emanating from the surface of the sample.

40 Claims, 7 Drawing Sheets

(56) References Cited

U.S. PATENT DOCUMENTS

| | | | |
|---|---|---|---|
| 5,578,821 | A | 11/1996 | Meisberger et al. |
| 6,410,924 | B1 | 6/2002 | Wang |
| 6,614,026 | B1* | 9/2003 | Adamec ............... H01J 37/1478 250/396 ML |
| 6,614,076 | B2* | 9/2003 | Kawasaki ............ H01L 27/1214 257/344 |
| 7,164,139 | B1 | 1/2007 | Toth et al. |
| 7,569,838 | B2 | 8/2009 | Watanabe et al. |
| 7,679,054 | B2 | 3/2010 | Frosien et al. |
| 7,863,580 | B2 | 1/2011 | Hatakeyama et al. |
| 8,283,629 | B1 | 10/2012 | Tuggle et al. |
| 8,294,093 | B1 | 10/2012 | Tuggle et al. |
| 8,592,761 | B2 | 11/2013 | Ren et al. |
| 2002/0015143 | A1* | 2/2002 | Yin ....................... G21K 1/087 355/133 |
| 2003/0183763 | A1* | 10/2003 | Bertsche ................ H01J 37/28 250/310 |
| 2003/0209667 | A1* | 11/2003 | Petrov .................... G01N 23/22 250/310 |
| 2004/0061067 | A1* | 4/2004 | Clauss ................ H01J 37/1475 250/396 ML |
| 2005/0116164 | A1* | 6/2005 | Goldenshtein ....... G01N 23/203 250/311 |
| 2007/0057182 | A1* | 3/2007 | Feuerbaum ............. G01N 1/32 250/310 |
| 2007/0158563 | A1* | 7/2007 | Goto ..................... H01J 37/147 250/310 |
| 2008/0035843 | A1 | 2/2008 | Hatano et al. |
| 2009/0039281 | A1 | 2/2009 | Kawasaki et al. |
| 2010/0051804 | A1* | 3/2010 | Adamec ................ H01J 37/244 250/307 |
| 2012/0217393 | A1 | 8/2012 | Okai et al. |
| 2014/0151552 | A1 | 6/2014 | Jiang et al. |
| 2015/0034836 | A1* | 2/2015 | Sohda ..................... G21K 1/093 250/398 |

OTHER PUBLICATIONS

Harald Rose aberration correction in electron microscopy Institute of Applied Physics vol. 97, Issue 7 https://accelconf.web.cern.ch/accelconf/p05/PAPERS/WOAC001.PDF, 2005.

K. Isuno et al. Third-order aberration theory of Wien filters for monochromators and aberration correctors Journal of Microscopy vol. 217, Issue 3, pp. 205-215, Mar. 2005 http://www.ncbi.nlm.nih.gov/pubmed/15725124.

D. Ioanoviciu Third order aberration theory of double Wien filters http://scitation.aip.org/content/aip/journal/rsi/75/11/10.1063/1.1777410, vol. 75 Issue 11 2004.

Rose H. Inhomogeneous Wien fitter as a corrector compensating for the chromatic and spherical aberration of low-voltage electron microscopes OPTIK, Wissenschaftliche Verlag GmbH, DE, vol. 84, No. 3, Mar. 1, 1990 (Mar. 1, 1990), pp. 91-107, XP002090185, ISSN:0030-4026, Coden Otikaj, Elsevier, Reflingen, Allemagne (1946).

Office Action dated Jan. 2, 2019 for CN Patent Application No. 201680025524.3.

* cited by examiner

METHOD AND SYSTEM FOR ABERRATION CORRECTION IN AN ELECTRON BEAM SYSTEM

CROSS-REFERENCE TO RELATED APPLICATION

The present application claims benefit under 35 U.S.C. § 119(e) and constitutes a regular (non-provisional) patent application of U.S. Provisional Application Ser. No. 62/158,632, filed May 8, 2015, entitled DUAL WIEN FILTER FOR MAIN FIELD ABERRATION CORRECTION IN ELECTRON BEAM SYSTEMS, naming Christopher Sears, Xinrong Jiang and Sameet K. Shriyan as inventors, which is incorporated herein by reference in the entirety.

TECHNICAL FIELD

The present invention generally relates to scanning electron microscopy, and, in particular, aberration correction in a scanning electron microscopy system.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size become smaller and smaller, it becomes critical to develop enhanced inspection and review devices and procedures.

One such inspection technology includes electron beam based inspection systems, such as, scanning electron microscopy (SEM). In one mode, SEM systems may image a surface of a sample through the collection and analysis of secondary electrons emitted from the surface of the sample as a primary beam is scanned across the sample. Typical SEM systems include a Wien filter located within the electron-optical column of the SEM and positioned above the sample for the purposes of deflecting the secondary electrons to a secondary electron detector. The utilization of such a Wien filter may cause transverse chromatic aberration in the primary beam. Therefore, it would be advantageous to provide a system and method that provides correction for transverse chromatic aberration in the primary beam.

SUMMARY

A scanning electron microscopy (SEM) apparatus is disclosed, in accordance with one or more embodiments of the present disclosure. In one illustrative embodiment, the SEM apparatus includes an electron beam source configured to generate a primary electron beam. In another illustrative embodiment, the SEM apparatus includes a sample stage configured to secure a sample. In another illustrative embodiment, the SEM apparatus includes a set of electron-optical elements configured to direct at least a portion of the primary electron beam onto a portion of the sample, wherein the set of electron-optical elements includes at least an upper deflector assembly and a lower deflector assembly, wherein the upper deflector assembly is configured to compensate for chromatic aberration in the primary electron beam caused by the lower deflector. In another illustrative embodiment, the SEM apparatus includes a detector assembly configured to detect electrons emanating from the surface of the sample.

An electron beam deflector is disclosed, in accordance with one or more embodiments of the present disclosure. In one illustrative embodiment, the electron beam deflector includes a set of non-magnetic electrostatic deflector elements. In another illustrative embodiment, the electron beam deflector includes a set of electromagnetic deflector elements, wherein the set of electromagnetic deflector elements are arranged along one or more portions of the set of non-magnetic electrostatic deflector elements, wherein two or more of the electromagnetic deflector elements overlap.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1A through 1F, a system and method for performing scanning electron microscopy (SEM) imaging is described in accordance with the present disclosure.

Embodiments of the present disclosure are directed to an SEM system with dual deflector assemblies suitable for correcting transverse chromatic aberration in the electron beam of the SEM system, while achieving large scan offset and signal beam positioning capabilities.

Figure 1A:
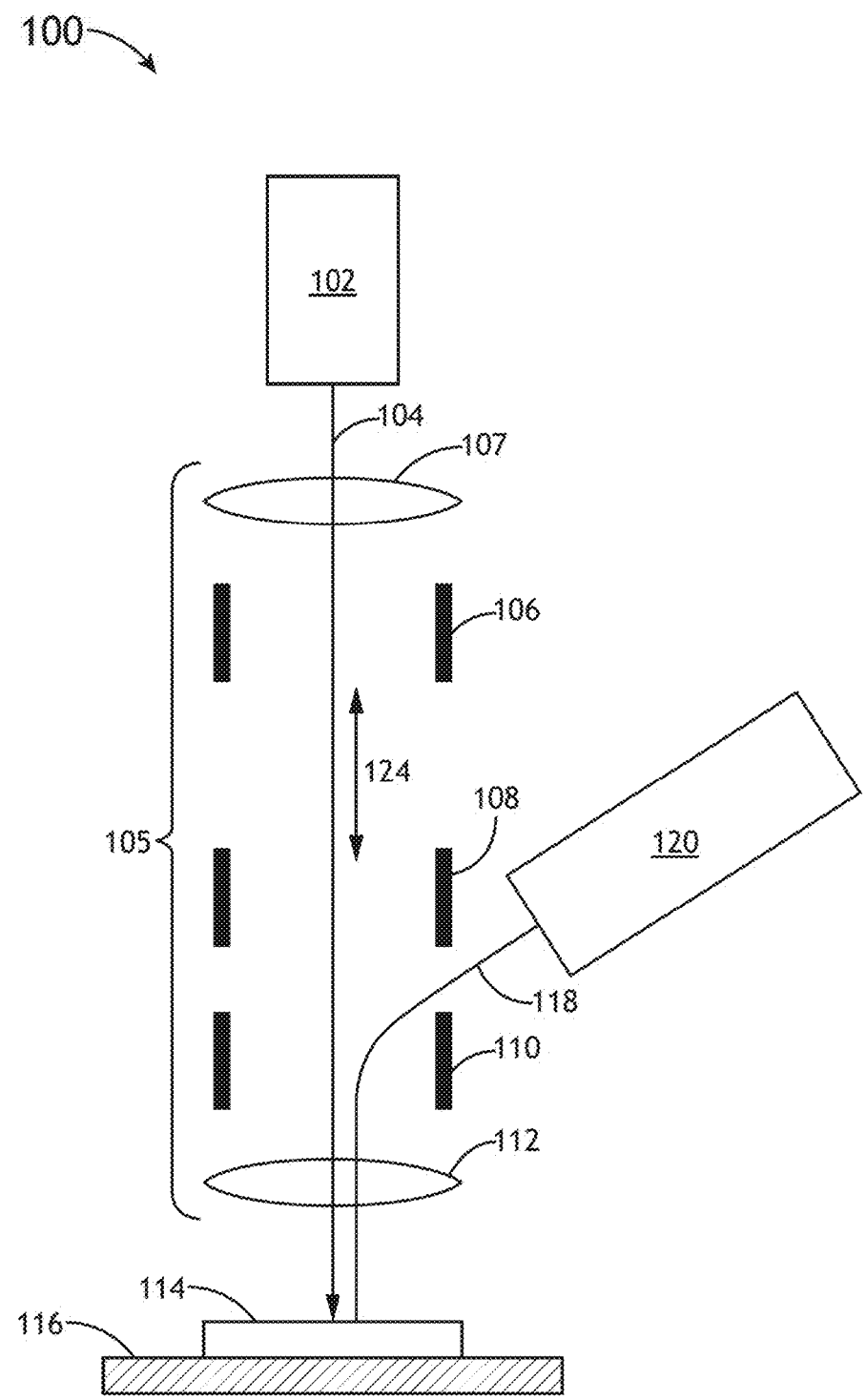
FIG. 1A is a simplified schematic view of a scanning electron microscopy system equipped with an upper deflector assembly, in accordance with one embodiment of the present disclosure.
Figure 1B:
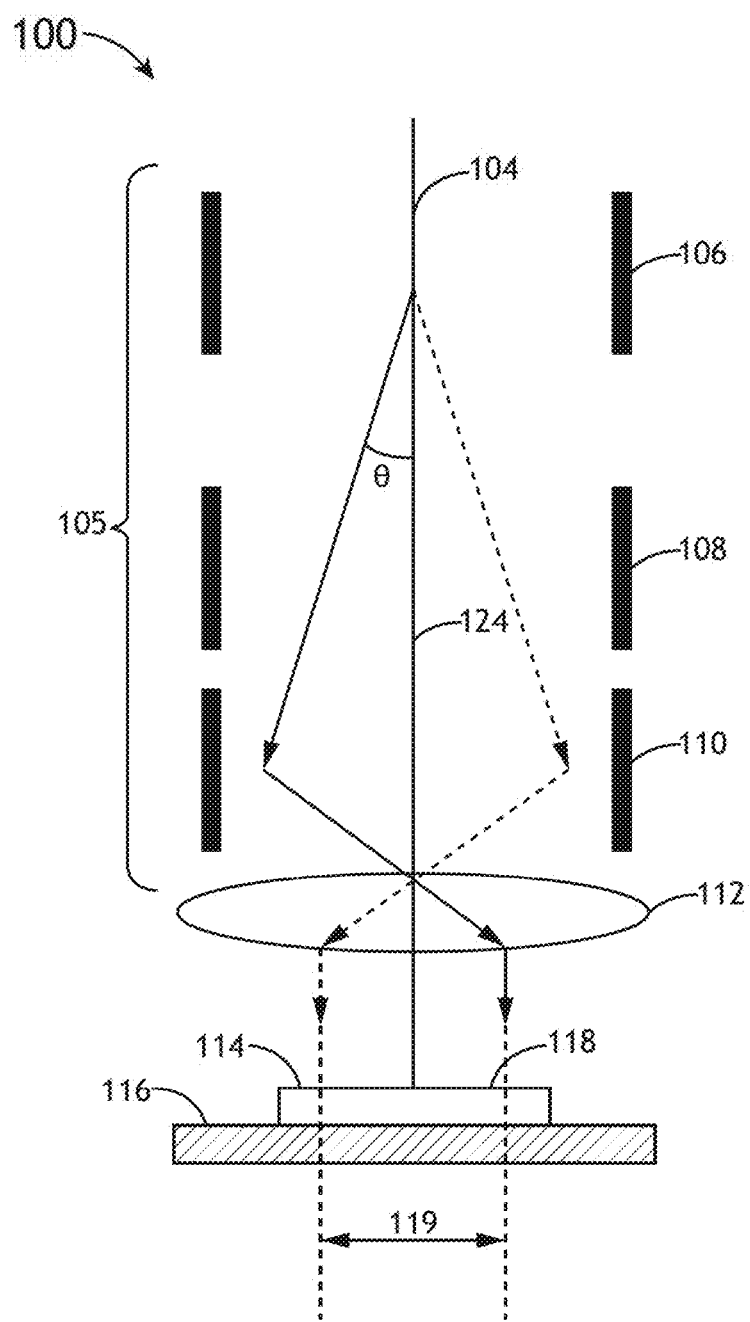
FIG. 1B is a simplified schematic view of a scanning electron microscopy system equipped with an upper deflector assembly causing an offset in the primary electron beam of the system, in accordance with one embodiment of the present disclosure.

FIGS. 1A-1B illustrate system 100 arranged for performing SEM imaging, in accordance with one embodiment of the present disclosure.

In one embodiment, the system 100 includes an electron beam source 102 for generating one or more electron beams 104. The electron beam source 102 may include any electron source known in the art. For example, the electron beam source 102 may include, but is not limited to, one or more electron guns. For instance, the electron beam source 102 may include a single electron gun for generating a single electron beam 104. In another instance, the electron beam source 102 may include multiple electron guns for generating multiple electron beams 104.

In another embodiment, the system 100 includes a sample stage 116. The sample stage 116 secures the sample 114. The sample 114 may include any sample suitable for inspection/review with electron-beam microscopy, such as, but not limited to, a substrate. The substrate may include, but is not limited to, a silicon wafer. In another embodiment, the sample stage 116 is an actuatable stage. For example, the sample stage 116 may include, but is not limited to, one or more translational stages suitable for selectably translating the sample 114 along one or more linear directions (e.g., x-direction, y-direction and/or z-direction). By way of another example, the sample stage 116 may include, but is not limited to, one or more rotational stages suitable for selectively rotating the sample 114 along a rotational direction. By way of another example, the sample stage 116 may include, but is not limited to, a rotational stage and a translational stage suitable for selectably translating the sample along a linear direction and/or rotating the sample 114 along a rotational direction. It is noted herein that the system 100 may operate in any scanning mode known in the art. For example, the system 100 may operate in a swathing mode when scanning the primary electron beam 104 across the surface of the sample 114. In this regard, the system 100 may scan the primary electron beam 104 across the sample 114, while the sample is moving, with the direction of scanning being nominally perpendicular to the direction of the sample motion. By way of another example, the system 100 may operate in a step-and-scan mode when scanning the primary electron beam 104 across the surface of the sample 114. In this regard, the system 100 may scan the primary electron beam 104 across the sample 114, which is nominally stationary when the beam 104 is being scanned.

In another embodiment, the system 100 includes a detector assembly 120. For example, the detector assembly 120 may be a secondary electron detector. It is noted that that the detector assembly 120 may include any type of electron detector known in the art. In one embodiment, secondary electrons may be collected and imaged using an Everhart-Thornley detector (or other type of scintillator-based detector). In another embodiment, electrons may be collected and imaged using a micro-channel plate (MCP). In another embodiment, electrons may be collected and imaged using a PIN or p-n junction detector, such as a diode or a diode array. In another embodiment, electrons may be collected and imaged using one or more avalanche photo diodes (APDs).

In another embodiment, the system 100 includes a set of electron-optical elements 105. The set of electron-optical elements 105 may form an electron-optical column defined by an optical axis 124 as shown in FIG. 1A. For purposes of simplicity, a single electron-optical column is depicted in FIG. 1A. It is noted herein that this configuration should not be interpreted as a limitation on the present disclosure. For example, the system 100 may include multiple electron-optical columns.

The set of electron-optical elements 105 may direct at least a portion of the primary electron beam 104 through onto a selected portion of the sample 114. The set of electron-optical elements may include any electron-optical elements known in the art suitable for focusing and/or directing the primary electron beam 104 through onto a selected portion of the sample 114. In one embodiment, the set of electron-optical elements 105 includes one or more electron-optical lenses. For example, the one or more electron-optical lenses may include, but are not limited to, one or more condenser lenses 107 (e.g., magnetic condenser lens) for collecting electrons from the electron beam source 102. By way of another example, the electron-optical lenses may include, but are not limited to, one or more objective lenses 112 (e.g., magnetic condenser lens) for focusing the primary electron beam 104 onto a selected region of the sample 114.

In one embodiment, the set of electron-optical elements 105 includes an upper deflector assembly 106 and a lower deflector assembly 110. In another embodiment, the upper deflect assembly 106 is configured to compensate for aberrations in the primary electron beam 104 (e.g., chromatic aberrations, or the like) caused by the lower deflector assembly 110.

In one embodiment, the lower deflector assembly 110 acts as a beam separator to separate the electron signal emanating from the surface of the sample 114 from the primary electron beam 104. For example, the lower deflector assembly 110 acts as a beam separator to separate the secondary electron signal emanating from the surface of the sample 114 from the primary electron beam 104. In this regard, the lower deflector assembly 110 allows for the primary electron beam 104 to pass through the lower beam separator 110, while directing secondary electrons to the detector assembly 120. Under operation without the upper deflector assembly 106, the lower deflect assembly 110 may cause chromatic aberration in the primary electron beam 104. For example, the lower deflector assembly 110 may introduce transverse chromatic aberration such that electrons within the primary electron beam 104 having different energy values propagate along different beam paths (e.g., exit the lower deflector assembly 110 at different angles, or the like). The implementation of the upper deflector assembly 110 acts to compensate for such chromatic aberration caused by the lower deflector assembly 110. For example, the upper deflector assembly 106 may introduce opposing chromatic aberration (e.g., transverse chromatic aberration) into primary electron beam 104 to mitigate chromatic aberration introduced by the lower deflector assembly 110. In this regard, chromatic aberration may be minimized and/or eliminated on the sample 114.

In one embodiment, the upper deflector assembly 106 and the lower assembly 110 are Wien filters. In one embodiment, the upper deflector assembly 106 provides a magnetic field that is electronically rotatable, where the electric and magnetic fields provided by the upper deflector assembly 106 are arranged orthogonal to each other, thereby causing zero net deflection in the primary electron beam 104. Further, the orientation of electric and magnetic fields within the upper deflector assembly 106 and the lower deflector assembly may be modified (e.g., rotated, or the like).

Further, the orientation of the electric and/or magnetic fields within the upper deflector assembly 106 may be adjusted to provide for compensation/cancellation of the transverse chromatic aberration otherwise generated by the lower deflector assembly 110. Additionally, the direction and/or the magnitude of dispersion (e.g., chromatic aberration, or the like) induced by the upper deflector assembly 106 may be modified. For example, the orientation of the electric field of the upper deflector assembly 106 may be adjusted (e.g., switched, rotated, or the like) to modify the dispersion of primary electron beam 104. By way of another example, the orientation of the magnetic field of the upper deflector assembly 106 with respect to the electric field of the upper deflector assembly 106 may be modified (e.g., switched, rotated, or the like) to modify the dispersion of the primary electron beam 104. For instance, fast switching of the orientations of electric and/or magnetic fields aids in aberration correction in a large field of view, which is particularly advantageous in inspection applications.

Referring now to FIG. 1B, in one embodiment, the upper deflector assembly 106 may control a spot size of the primary electron beam 104 on the surface of the sample 114. In one embodiment, the upper deflector assembly 106 controls a spot size of the primary electron beam 104 on the surface of the sample 114 by generating an offset in position of the primary electron beam 104 from an optical axis 124 of the SEM system 100. For example, the offset may be characterized by the offset angle θ. As shown in FIG. 1B, the primary electron beam 104 is offset relative to the optical axis 124 and passes through the objective lens 112. For example, the primary electron beam 104 may pass through a coma-free plane in the objective lens 112. The primary beam 104 then telecentrically lands on the surface of the sample 104, thereby establishing a large scan area 119. It is noted that the rotation of the electric and/or magnetic fields of the upper deflector assembly 106, along with the offset implemented with the upper deflector assembly 106 results in a landing beam with a large offset corrected for transverse chromatic aberration caused by the lower deflector assembly 110. It is further noted that the synchronization of the main field scan provided by the lower deflector assembly 110 with rotations of electric and/or magnetic fields of the upper deflector assembly 106 provides enhanced image quality at large field of view.

In another embodiment, field curvature and/or stigmation present in the primary electron beam 104 may be corrected using stigmators and/or the use of a fast focus procedure (not shown).

In another embodiment, the upper deflector assembly 106 may implement a static scan of the primary electron beam 104 across a selected area of the sample 114. In this regard, the upper deflector assembly 106 may provide a static scan offset in the beam across a selected area of the sample 114 without the need for stage actuation. For example, the upper deflector assembly 106 may be utilized to scan the primary electron beam 104 across the sample 114 in a selected pattern.

Referring again to FIG. 1A, in another embodiment, the lower deflector assembly 110 directs the electrons 118 (e.g., secondary electrons) emanating from the surface of the sample 114 onto a selected portion of the detector assembly 120. For example, the lower deflector assembly 110 may position an electron cloud associated with the electrons 118 emanating from the surface of the sample 114 onto a selected detector channel of the detector assembly 120. For instance, in the case of secondary electrons, the lower deflector assembly 110 may center/focus the secondary electron cloud onto a selected detector channel of the detector assembly 120.

In another embodiment, the set of electron-optical elements 105 includes a pre-deflector 108.

Figure 1C:
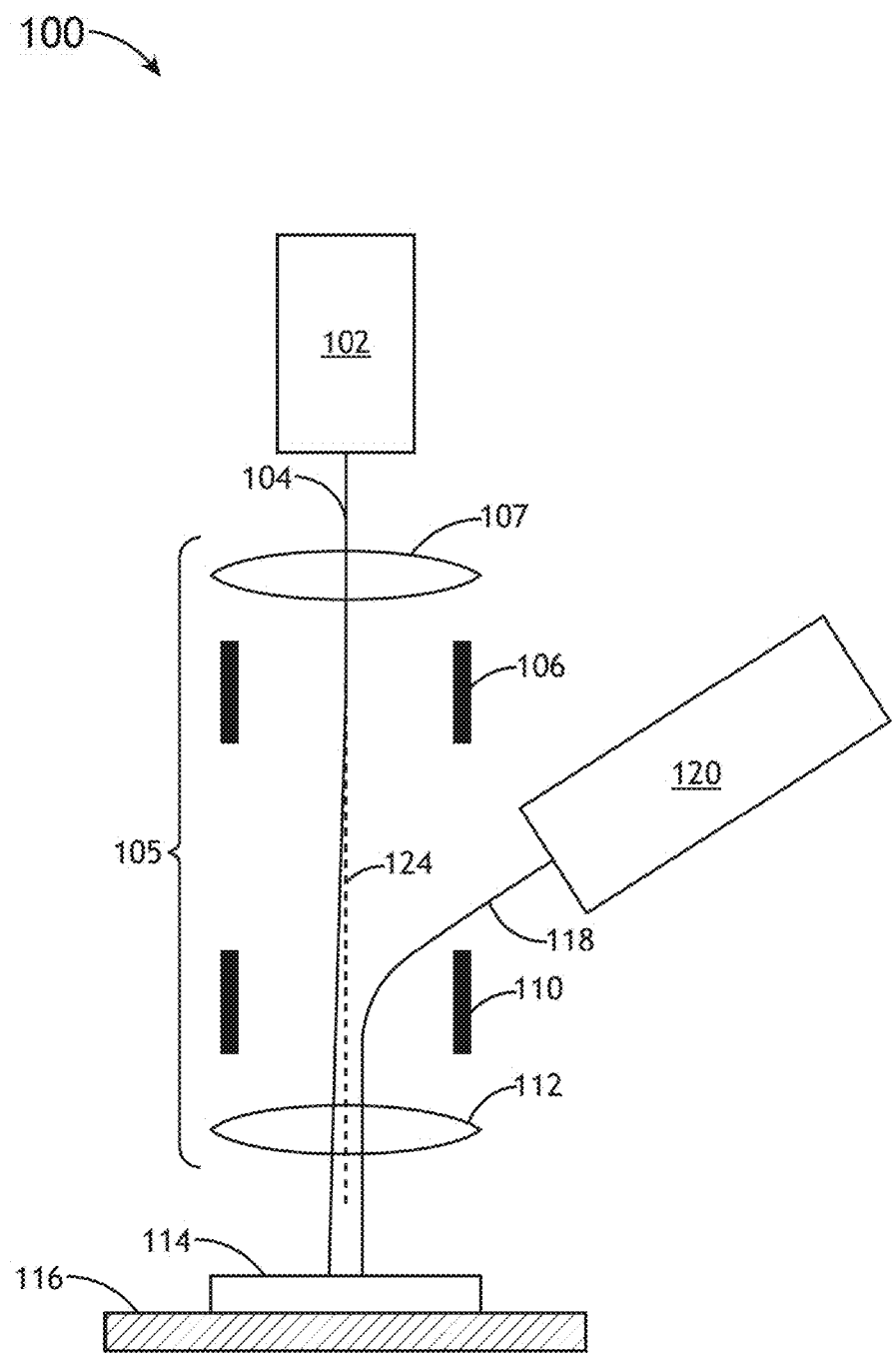
FIGS. 1C-1D are simplified schematic views of a scanning electron microscopy system equipped with an upper deflector assembly causing tilt in the primary electron beam of the system, in accordance with one embodiment of the present disclosure.
Figure 1D:
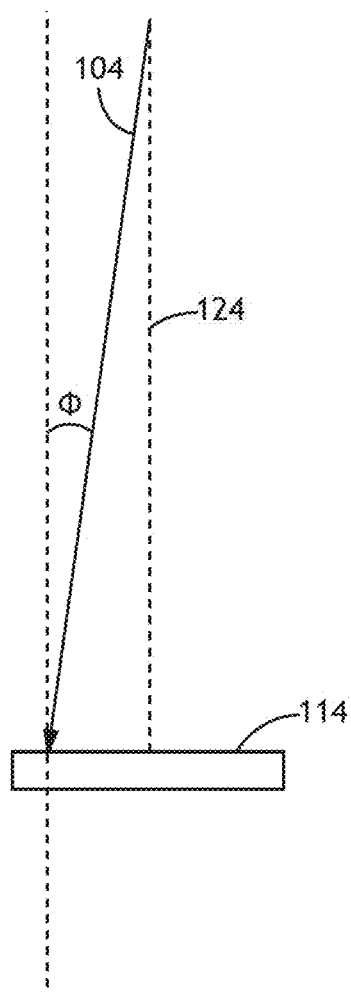

FIGS. 1C-1D illustrate simplified schematic views of the scanning electron microscopy system 100, where the upper deflector assembly causes tilt in the primary electron beam of the system, in accordance with one embodiment of the present disclosure. In one embodiment, the upper deflector assembly 106 tilts the primary electron beam 104 relative to the optical axis 124 of the SEM system 100. For example, as shown in FIG. 1D, the upper deflector assembly 106 may tilt the primary electron beam 104 by a selected angle φ relative to the optical axis 124 of the SEM system 100. For instance, the upper deflector assembly 106 may tilt the primary electron beam 104 by a selected polar and/or azimuthal angle relative to the optical axis 124 of the SEM system 100. It is noted that the large transverse chromatic aberrations introduced while at static tilt are correctable by using the upper deflector assembly 106 through rotation of the crossed electric and/or magnetic fields of the upper deflector assembly 106 in a given direction. It is noted that such a configuration is suitable for use in electronic tilt inspection, which is further enhanced by the correction of the transverse chromatic aberration introduced during static deflection by the lower deflector assembly.

In another embodiment, the upper deflector assembly 106 may also serve to correct stigmation in the primary electron beam 104. For example, the voltages on the electrostatic deflector elements of the upper deflector assembly 106 may be controlled to form a selected stigmation field, providing an electron beam 104 that is more circular such that beam achieves focus on a single plane. For instance, the stigmation field may be formed in the 0 and 45 degree direction.

While it is noted above that the primary electron beam landing may be telecentric, this is not a limitation on the scope of the present disclosure. In some embodiments, the upper deflector assembly 106 may be used to cause the primary electron beam 104 to land non-telecentrically. It is further noted that a non-telecentric landing of the primary electron beam 104 may be particularly advantageous as it may allow for further improvement of the spot size of the primary electron beam 104 to eliminate coma.

Figure 1E:
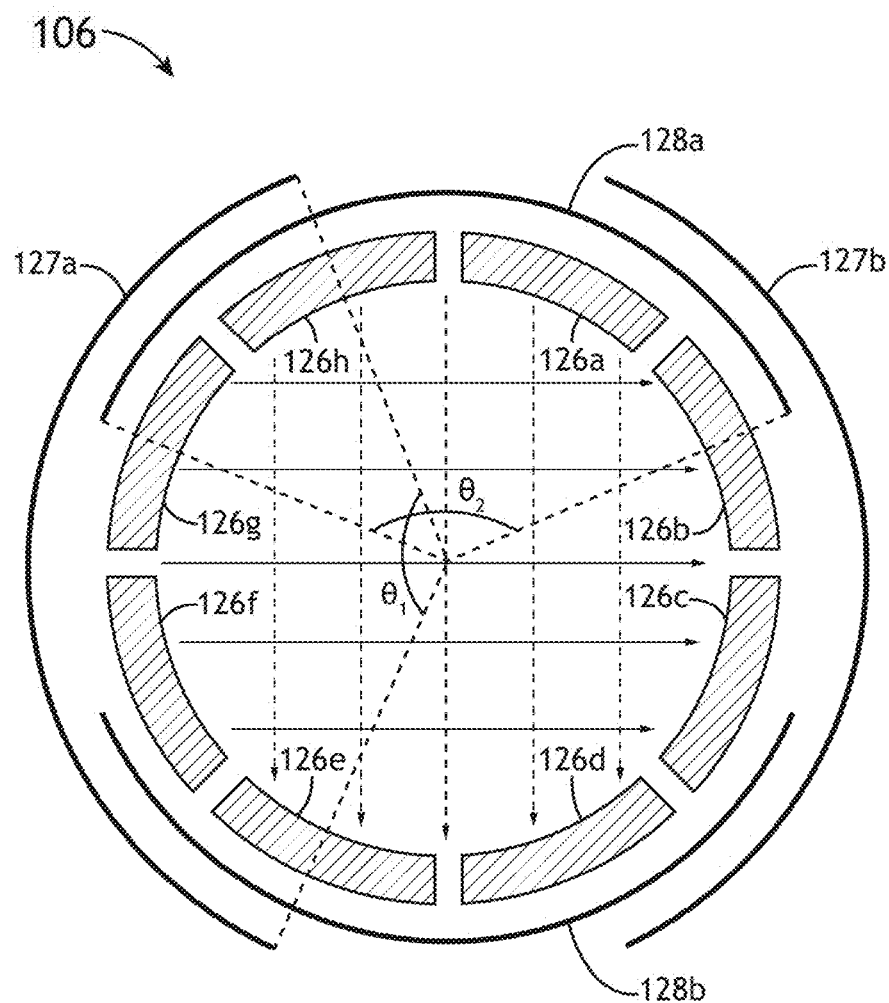
FIG. 1E is a simplified schematic top view of an electron beam deflector assembly including a set of non-magnetic electrostatic deflector elements and a set of electromagnetic deflector elements, in accordance with one embodiment of the present disclosure.
Figure 1F:
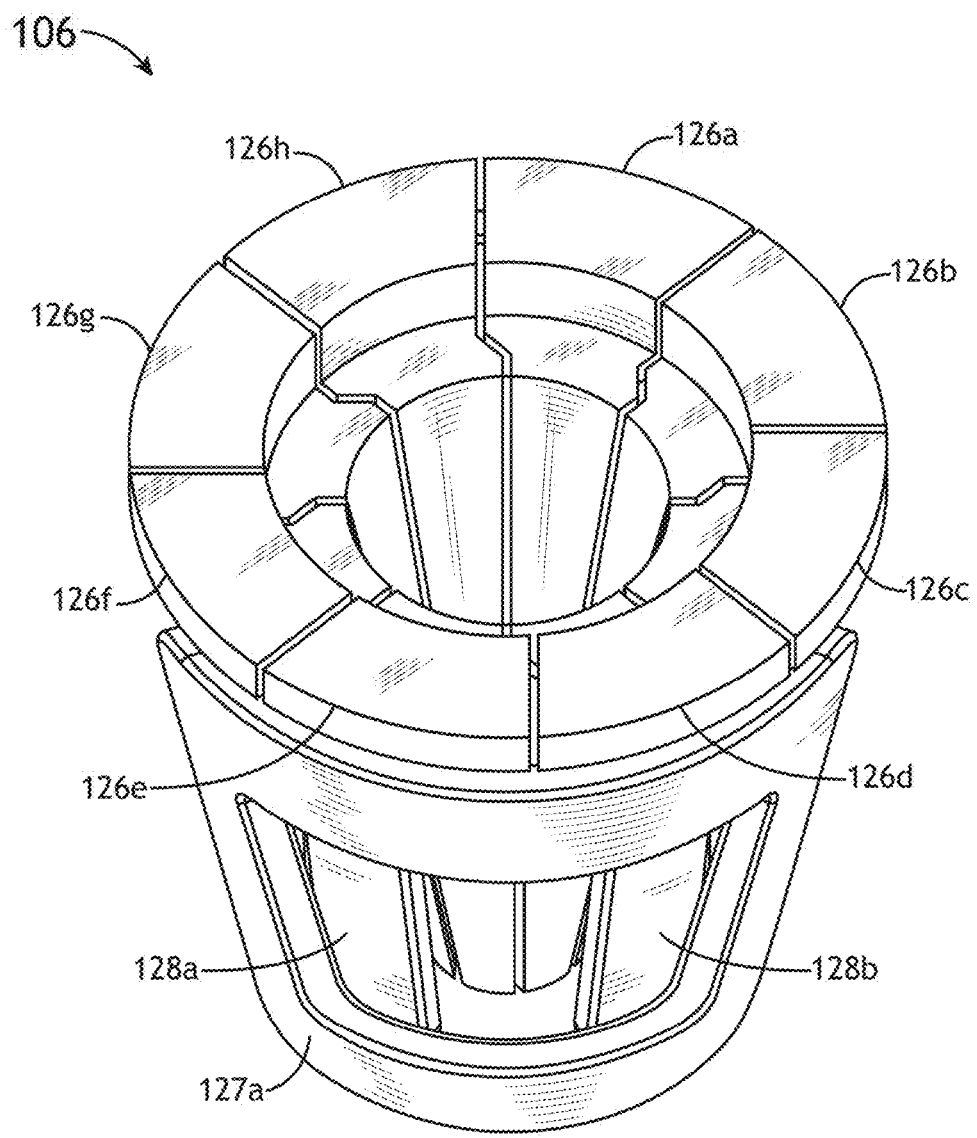
FIG. 1F is a detailed schematic view of an electron beam deflector assembly including a set of non-magnetic electrostatic deflector elements and a set of electromagnetic deflector elements, in accordance with one embodiment of the present disclosure.

FIGS. 1E-1F are schematic views of an electron beam deflector assembly including a set of non-magnetic electrostatic deflector elements and a set of electromagnetic deflector elements, in accordance with one embodiment of the present disclosure. In one embodiment, the upper electron beam deflector 106 and/or the lower electron beam deflector 110 includes a set of non-magnetic electrostatic deflector elements. In another embodiment, the upper electron beam deflector 106 and/or the lower electron beam deflector 110 includes a set of electromagnetic deflector elements, wherein the set of electromagnetic deflector elements are arranged along one or more portions of the set of non-magnetic electrostatic deflector elements. It is noted that, while the following description will focus on the configuration of the upper deflector assembly 106, the configuration depicted in FIGS. 1E-1F may be extended to the lower assembly 110.

Referring to FIG. 1E, a simplified top view of the upper deflector assembly 106 is illustrated in accordance with one embodiment of the present invention. For example, as shown in FIG. 1E, the upper deflector assembly 106 includes non-magnetic electrostatic deflector elements 126*a*-126*h* and electromagnetic deflector elements 127*a*, 127*b*, 128*a*, and 128*b*. The non-magnetic electrostatic deflector elements may include any non-magnetic electrostatic deflector element known in the art, such as, but not limited to, an electrostatic plate (e.g., metal electrode). The electrostatic deflector elements 126a-126h provide the necessary electric field and provides for electronic rotation of the electric field (directed by controller 140). The electromagnetic deflector elements may include any magnetic deflector element known in the art, such as, but not limited to, a magnetic coil (e.g., magnetic coil formed from copper wire or another metal). The electromagnetic deflector elements 127a, 127b, 128a and 128b provide the necessary magnetic field and provides for electronic rotation of the magnetic field (directed by controller 140). As previously noted, proper rotation of the electric and/or magnetic fields (e.g., the crossed electric and magnetic fields) in the upper deflector assembly 106 with respect to the main field deflection ensures transverse chromatic aberration cancellation. In addition, synchronizing the main field scan with the upper deflector assembly 106 ensures enhanced image quality at a large field of view.

The magnetic and electric fields are depicted conceptually in FIG. 1E with dotted (magnetic field) and solid (electric field) lines. It is noted that these fields are not static and, thus, the fields depicted in FIG. 1E represent merely one instance of the field orientation. The non-magnetic electrostatic elements allow for high speed rotation of the electric and magnetic fields so as to follow the main field deflection pattern of the system 100, while maintaining the condition of crossed electric and magnetic fields associated with a Wien filter and correcting for the aberration caused by the lower deflector assembly 110. In another embodiment, the electric and magnetic fields are arranged orthogonal to each other, thereby causing zero net deflection in the primary electron beam 104.

In one embodiment, a first electromagnetic deflector element 127a of the set of electromagnetic deflector elements spans a first portion of the set of non-magnetic electrostatic deflector elements, which corresponds to a first angle $\theta 1$ about the center of the set of non-magnetic electrostatic deflector elements. In another embodiment, a second electromagnetic deflector element 128a of the set of electromagnetic deflector elements spans a second portion of the set of non-magnetic electrostatic deflector elements, which corresponds to a second angle $\theta 2$ about the center of the set of non-magnetic electrostatic deflector elements.

In another embodiment, the set of electromagnetic deflector elements may include pairs of electromagnetic deflector elements. For example, the set of electromagnetic deflector elements may include a first pair of electromagnetic deflector elements formed with element 127a and element 127b, which each span the same angle $\theta 1$ along the non-magnetic deflector elements. By way of another example, the set of electromagnetic deflector elements may include a second pair of electromagnetic deflector elements formed with element 128a and element 128b, which each span the same angle $\theta 2$ along the non-magnetic deflector elements.

In one embodiment, the angle $\theta 1$ and $\theta 2$ are the same. In this regard, the elements 127a and 128a (or the element pairs 127a, 127b and 128a, 128b) may span the same angle along the non-magnetic electrostatic deflector elements. In another embodiment, the angle $\theta 1$ and $\theta 2$ are different. In this regard, the elements 127a and 128a (or the element pairs 127a, 127b and 128a, 128b) may span different angles along the non-magnetic electrostatic deflector elements. For example, one or more of the elements 127a, 127b, 128a and 128b may span an angle between 60-120 degrees. For instance, each of the elements 127a, 127b, 128a and 128b may span an angle of 120 degrees along the set of non-magnetic electrostatic elements.

In another embodiment, adjacent electromagnetic elements of the set of electromagnetic elements may overlap. For example, as shown in FIG. 1E, electromagnetic element 127a overlaps electromagnetic elements 128a and 128b. By way of another example, as shown in FIG. 1E, electromagnetic element 127b also overlaps electromagnetic elements 128a and 128b.

As shown in FIG. 1E, in one embodiment, the upper deflector assembly 106 may include 8 non-magnetic electrostatic deflector elements with 4 electromagnetic deflector elements spanning selected portions of the set of non-magnetic electrostatic deflector elements. In another embodiment, although not shown in FIG. 1E, the upper deflector assembly 106 may include 8 non-magnetic electrostatic deflector elements with 8 electromagnetic deflector elements spanning selected portions of the set of non-magnetic electrostatic deflector elements.

It is noted that the arrangement depicted in FIG. 1E is not a limitation on the scope of the present disclosure and any number of electromagnetic devices and/or pairs of electromagnetic devices may be implemented in the upper deflector assembly 106. For example, the set of electromagnetic deflector elements may include between 4 and 8 electromagnetic elements. For instance, the set of electromagnetic elements may be arranged in a quadrupole, hexapole or octupole configuration. By way of another example, the set of non-magnetic electrostatic elements may include between 4 and 8 electrostatic elements. For instance, the set of electrostatic elements may be arranged in a quadrupole, hexapole or octupole configuration.

Referring now to FIG. 1F, a detailed schematic view of the upper deflector assembly 106 is illustrated in accordance with one embodiment of the present disclosure. As shown in FIG. 1F, the upper deflect assembly 106 includes electrostatic deflection elements 126a-126h, which are surrounded by the electromagnetic deflection elements. It is noted that in the view of FIG. 1F only electromagnetic deflection elements 127a and end portions of 128a and 128b are visible.

Figure 1G:
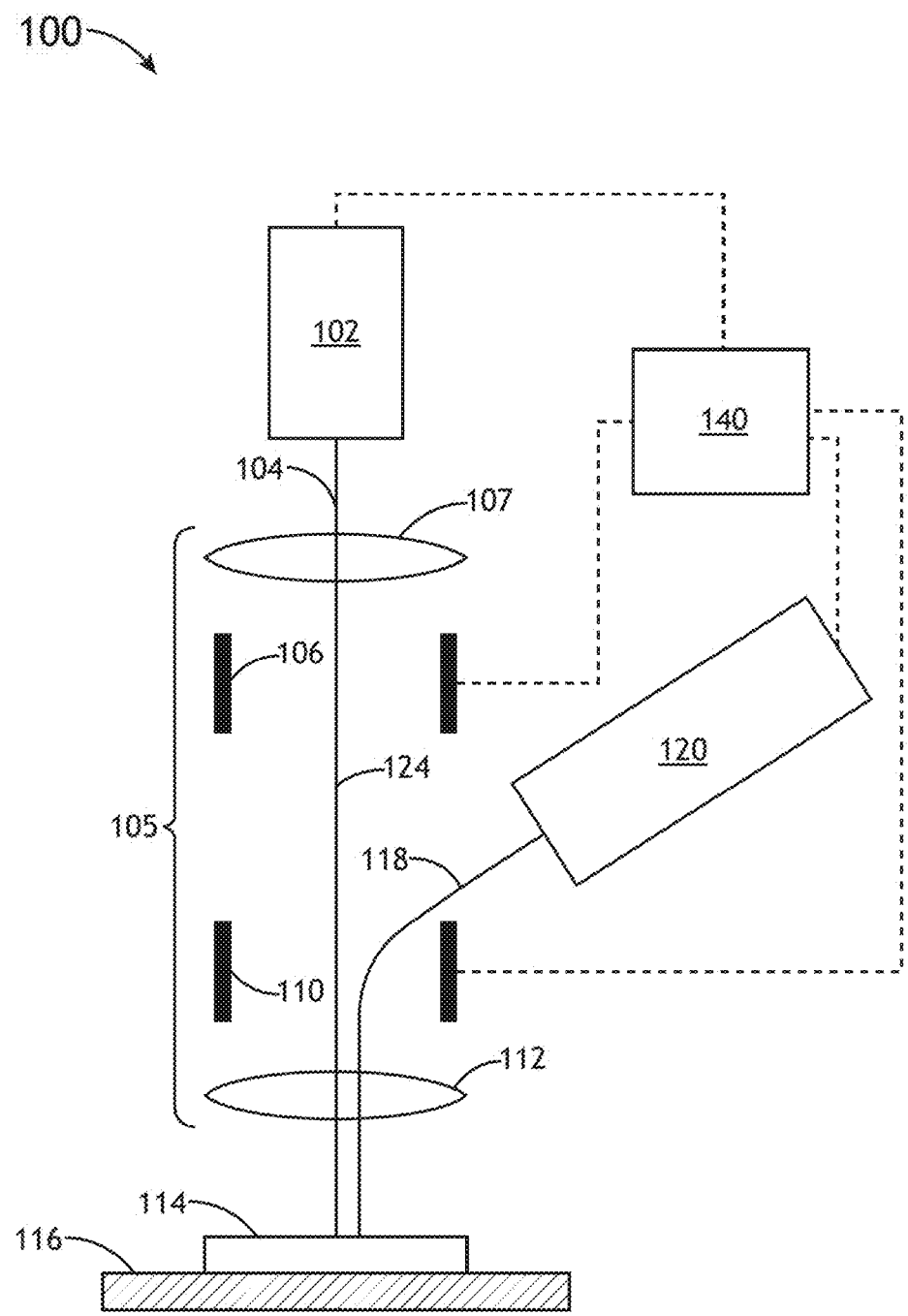
FIG. 1G is a simplified schematic view of a scanning electron microscopy system equipped with a controller, in accordance with one embodiment of the present disclosure.

FIG. 1G illustrates a simplified schematic view of the scanning electron microscopy system 100 equipped with controller 140, in accordance with one embodiment of the present disclosure. In one embodiment, the controller 140 is communicatively coupled with one or more of the previously described components of system 100. For example, the controller 140 may be communicatively coupled with one or more of the upper detector assembly 106, the lower detector assembly 110, the electron source 102 or the detector assembly 120. In this regard, the controller 140 may direct any of the components of system 100 to carry out any one or more of the various functions described previously herein. For example, the controller 140 may direct the upper deflector assembly 106 to adjust the field of the upper deflector assembly 106 so as to correct transverse chromatic aberration produced by the lower deflector assembly 110. By way of another example, the controller 140 may direct the upper deflector assembly 106 to adjust the field of the upper deflector assembly 106 so as to cause a tilt in the primary electron beam 104. By way of another example, the controller 140 may direct the upper deflector assembly 106 to adjust the field of the upper deflector assembly 106 so as to center the secondary electron beam emanating from the sample 114 onto detector assembly 120. By way of another example, the controller 140 may direct the upper deflector assembly 106 to adjust the field of the upper deflector assembly 106 so as to adjust one or more offset or one or more scanning parameters of the primary electron beam 104.

In one embodiment, the controller 140 includes one or more processors (not shown) configured to execute program instructions suitable for causing the one or more processors to execute one or more steps described in the present disclosure. In one embodiment, the one or more processors of the controller 140 may be in communication with a memory medium (e.g., non-transitory storage medium) containing the program instructions configured to cause the one or more processors of the controller 140 to carry out various steps described through the present disclosure. It should be recognized that the various processing steps described throughout the present disclosure may be carried out by a single computing system or, alternatively, a multiple computing system. The controller 140 may include, but is not limited to, a personal computer system, mainframe computer system, workstation, image computer, parallel processor, or any other device known in the art. In general, the term "computer system" may be broadly defined to encompass any device having one or more processors or processing elements, which execute instructions from a memory medium. Moreover, different subsystems of the system 100 may include a computer system or logic elements suitable for carrying out at least a portion of the steps described above. Therefore, the above description should not be interpreted as a limitation on the present disclosure but merely an illustration.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and/or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A scanning electron microscopy apparatus comprising:
an electron beam source configured to generate a primary electron beam;
a sample stage configured to secure a sample;
a set of electron-optical elements configured to direct at least a portion of the primary electron beam onto a portion of the sample, wherein the set of electron-optical elements includes at least an upper deflector assembly and a lower deflector assembly, wherein the upper deflector assembly is configured to compensate for transverse chromatic aberration in the primary electron beam caused by the lower deflector assembly, wherein the upper deflector assembly is configured to rotate at least one of the electric field or magnetic field associated with non-magnetic electrostatic elements of the upper deflector assembly to cause at least one of the electric field or the magnetic field to follow a deflection pattern of the main field of the lower deflector assembly; and
a detector assembly configured to detect electrons emanating from the surface of the sample.

2. The apparatus of claim 1, wherein the upper deflector assembly is configured to control a spot size of the primary electron beam on the surface of the sample.

3. The apparatus of claim 2, wherein the upper deflector assembly is configured to control a spot size of the primary electron beam on the surface of the sample by generating an offset of the primary electron beam from an optical axis of the scanning electron microscopy apparatus, wherein the offset is defined by an offset angle.

4. The apparatus of claim 1, wherein the upper deflector assembly is configured to scan the primary electron beam across a selected area of the sample.

5. The apparatus of claim 1, wherein the upper deflector assembly is configured to direct the electrons emanating from the surface of the sample onto a selected portion of the detector assembly.

6. The apparatus of claim 5, wherein the upper deflector assembly is configured to position an electron cloud associated with the electrons emanating from the surface of the sample onto a selected detector channel of the detector assembly.

7. The apparatus of claim 1, wherein the lower deflector assembly directs electrons emanating from the sample to the detector assembly.

8. The apparatus of claim 7, wherein the lower deflector assembly separates electrons emanating from the sample from the primary electron beam and directs the electrons emanating from the sample to the detector assembly.

9. The apparatus of claim 1, wherein the upper deflector assembly is configured to tilt the primary electron beam relative to an optical axis of the scanning electron microscopy apparatus.

10. The apparatus of claim 1, wherein the upper deflector assembly is configured to correct stigmation within the primary electron beam.

11. The apparatus of claim 1, wherein the upper deflector assembly causes the primary electron beam to land telecentrically onto the sample.

12. The apparatus of claim 1, wherein the upper deflector assembly causes the primary electron beam to land non-telecentrically onto the sample.

13. The apparatus of claim 1, wherein at least one of the upper deflector assembly or lower deflector assembly comprises:
a Wien filter.

14. The apparatus of claim 13, wherein at least one of the upper deflector assembly or lower deflector assembly comprises:
at least one of an octupole deflector assembly, a hexapole deflector assembly or a quadrupole deflector assembly.

15. The apparatus of claim 1, wherein at least one of the upper deflector assembly or lower deflector assembly comprises:
a set of non-magnetic electrostatic deflector elements; and
a set of electromagnetic deflector elements, wherein the set of electromagnetic deflector elements are arranged along one or more portions of the set of non-magnetic electrostatic deflector elements.

16. The apparatus of claim 15, wherein a first electromagnetic deflector element of the set of electromagnetic deflector elements spans a first portion of the set of non-magnetic electrostatic deflector elements corresponding to a first angle about the center of the set of non-magnetic electrostatic deflector elements.

17. The apparatus of claim 16, wherein an additional electromagnetic deflector element of the set of electromagnetic deflector elements spans an additional portion of the set of non-magnetic electrostatic deflector elements corresponding to an additional angle about the center of the set of non-magnetic electrostatic deflector elements.

18. The apparatus of claim 17, wherein the first angle and the additional angle are the same.

19. The apparatus of claim 17, wherein the first angle and the additional angle are different.

20. The apparatus of claim 15, wherein one or more of the sets of electromagnetic deflector elements comprise:
an electromagnetic coil.

21. The apparatus of claim 15, wherein the set of non-magnetic electrostatic deflector elements includes between four and eight non-magnetic electrostatic deflector elements and the set of electromagnetic deflector elements includes between four and eight electromagnetic deflector elements.

22. The apparatus of claim 21, wherein the set of non-magnetic electrostatic deflector elements includes eight non-magnetic electrostatic deflector elements and the set of electromagnetic deflector elements includes four electromagnetic deflector elements.

23. The apparatus of claim 21, wherein the set of non-magnetic electrostatic deflector elements includes eight non-magnetic electrostatic deflector elements and the set of electromagnetic deflector elements includes eight electromagnetic deflector elements.

24. The apparatus of claim 1, wherein the set of electron-optical elements further comprises:
at least one of a condenser lens or objective lens.

25. The apparatus of claim 1, wherein the set of electron-optical elements further comprises:
a pre-deflector assembly.

26. The apparatus of claim 1, wherein the electron beam source comprises:
one or more electron guns.

27. The apparatus of claim 1, wherein the detector assembly comprises:
one or more secondary electron detectors.

28. The apparatus of claim 27, wherein the detector assembly comprises:
an Everhart-Thornley secondary electron detector.

29. The apparatus of claim 1, further comprising:
a controller communicatively coupled to at least the upper deflector assembly and configured to adjust one or more parameters of the upper deflector assembly so as to control one or more parameters of at least one of the primary electron beam or the electrons emanating from the surface of the sample.

30. An electron beam deflector assembly comprising:
a set of non-magnetic electrostatic deflector elements; and
a set of electromagnetic deflector elements, wherein the set of electromagnetic deflector elements are arranged along one or more portions of the set of non-magnetic electrostatic deflector elements, wherein two or more of the electromagnetic deflector elements overlap, wherein the set of non-magnetic electrostatic deflector elements and the set of electromagnetic deflector elements form an upper deflector assembly in an electron-optical column and are configured to compensate for transverse chromatic aberration in a primary electron beam caused by a lower deflector assembly of the electron-optical column, wherein the upper deflector assembly is configured to rotate at least one of the electric field or magnetic field associated with the set of non-magnetic electrostatic elements of the upper deflector assembly to cause at least one of the electric field or the magnetic field to follow a deflection pattern of the main field of the lower deflector assembly.

31. The apparatus of claim 30, wherein the electron beam deflector assembly is a Wien filter.

32. The apparatus of claim 31, wherein the electron beam deflector assembly comprises:
at least one of an octupole deflector assembly, a hexapole deflector assembly or a quadrupole deflector assembly.

33. The apparatus of claim 30, wherein a first electromagnetic deflector element of the set of electromagnetic deflector elements spans a first portion of the set of non-magnetic electrostatic deflector elements corresponding to a first angle about the center of the set of non-magnetic electrostatic deflector elements.

34. The apparatus of claim 33, wherein an additional electromagnetic deflector element of the set of electromagnetic deflector elements spans an additional portion of the set of non-magnetic electrostatic deflector elements corresponding to an additional angle about the center of the set of non-magnetic electrostatic deflector elements.

35. The apparatus of claim 34, wherein the first angle and the additional angle are the same.

36. The apparatus of claim 34, wherein the first angle and the additional angle are different.

37. The apparatus of claim 30, wherein one or more of the sets of electromagnetic deflector elements comprise:
an electromagnetic coil.

38. The apparatus of claim 30, wherein the set of non-magnetic electrostatic deflector elements includes between four and eight non-magnetic electrostatic deflector elements and the set of electromagnetic deflector elements includes between four and eight electromagnetic deflector elements.

39. The apparatus of claim 38, wherein the set of non-magnetic electrostatic deflector elements includes eight non-magnetic electrostatic deflector elements and the set of electromagnetic deflector elements includes four electromagnetic deflector elements.

40. The apparatus of claim 38, wherein the set of non-magnetic electrostatic deflector elements includes eight non-magnetic electrostatic deflector elements and the set of electromagnetic deflector elements includes eight electromagnetic deflector elements.

\* \* \* \* \*